(12) United States Patent
Choi

(10) Patent No.: US 8,233,290 B2
(45) Date of Patent: Jul. 31, 2012

(54) UNIFIED CONTROL SWITCH MODULE FOR VEHICLES

(75) Inventor: Won Seok Choi, Seoul (KR)

(73) Assignees: Kia Motors Corporation, Seoul (KR); Hyundai Motor Company, Seoul (KR)

( * ) Notice: Subject to any disclaimer, the term of this patent is extended or adjusted under 35 U.S.C. 154(b) by 406 days.

(21) Appl. No.: 12/286,766

(22) Filed: Oct. 2, 2008

(65) Prior Publication Data

US 2009/0154133 A1  Jun. 18, 2009

(30) Foreign Application Priority Data

Dec. 17, 2007  (KR) .................. 10-2007-0132844

(51) Int. Cl.
 *H05K 7/02* (2006.01)
(52) U.S. Cl. ........................ 361/812; 361/807
(58) Field of Classification Search .................. 361/784, 361/803, 811–813, 825, 826; 200/16 R, 200/302.1, 5 A See application file for complete search history.

(56) References Cited

U.S. PATENT DOCUMENTS

| 3,854,018 | A | * | 12/1974 | Reynolds et al. | ............. | 200/5 A |
| 4,324,956 | A | * | 4/1982 | Sakakino et al. | ........... | 200/16 R |
| 5,383,148 | A | * | 1/1995 | Testa et al. | ...................... | 365/52 |
| 6,967,296 | B2 | * | 11/2005 | Kato | ......................... | 200/61.54 |
| 2009/0049601 | A1 | * | 2/2009 | Shih | ................................. | 4/679 |
| 2010/0059347 | A1 | * | 3/2010 | Tang et al. | ................. | 200/302.1 |

\* cited by examiner

*Primary Examiner* — Yuriy Semenenko

(74) *Attorney, Agent, or Firm* — Edwards Wildman Palmer LLP; Peter F. Corless

(57) ABSTRACT

A unified control switch module includes a printed circuit board, a waterproof pad, and one or more knobs. The printed circuit board includes switches and light-emitting elements mounted thereon. The waterproof pad is coupled to the printed circuit board, and is provided with first protrusions, which are formed at respective locations that correspond to the switches, and second protrusions having respective through-holes, which are formed at respective locations that correspond to the light-emitting elements. The knobs are located on the waterproof pad, and are provided with respective lower ends, which are formed to extend outwards from the through-holes.

3 Claims, 3 Drawing Sheets

PRIOR ART

[FIG 2A]
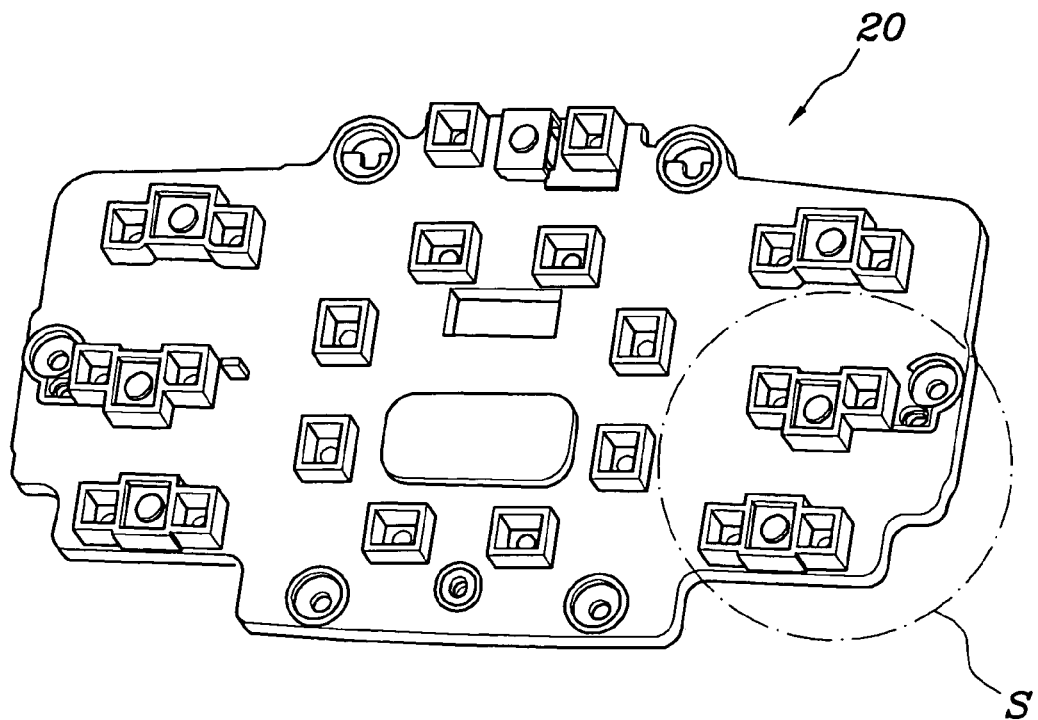
[FIG 2B]
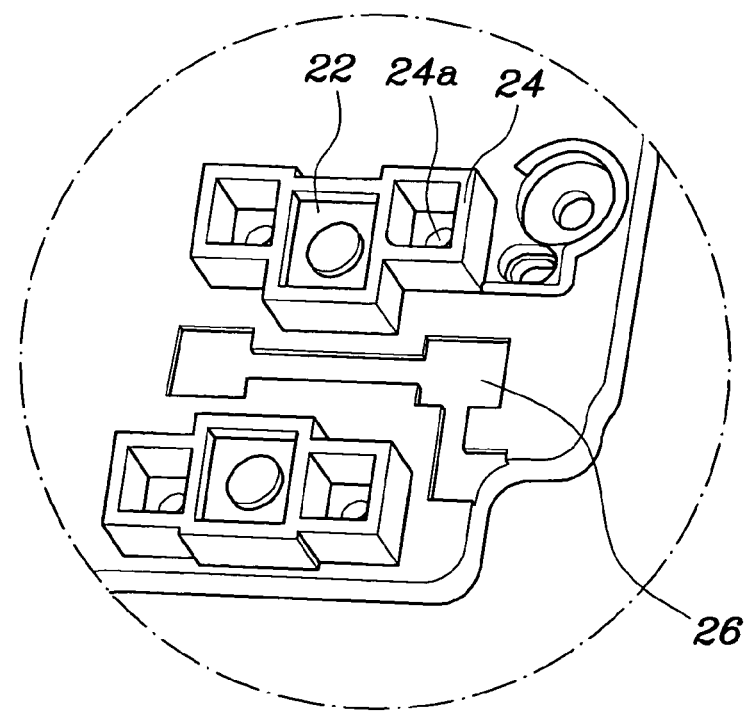

UNIFIED CONTROL SWITCH MODULE FOR VEHICLES

CROSS-REFERENCE TO RELATED APPLICATIONS

This application claims priority to Korean Application No. 10-2007-0132844, filed on Dec. 17, 2007, the entire disclosure of which is incorporated herein by reference.

BACKGROUND

1. Technical Field

The present invention relates generally to a unified control switch module for vehicles and, more particularly, to a unified control switch module for vehicles, in which a waterproof pad is coupled to a printed circuit board, thus not only preventing a malfunction or breakdown cause by inflow of water from occurring but also reducing manufacturing costs.

2. Background Art

As shown in FIG. 1A, a unified control switch unit is mounted on the indicator cover 1 of a vehicle according to the type of the vehicle.

The unified control switch unit includes a dial and buttons mounted around the dial. A printed circuit board, which receives signals generated by the dial and the buttons, is mounted to the lower surface of the unified control switch unit.

As shown in FIG. 1B, switches 12, which are contacts, and light-emitting elements 14 are mounted on the printed circuit board 10.

Typically, the switches and light-emitting elements are not coated because such a coating may deteriorate driver's feeling of manipulating the unified control switch unit and change the color of the light-emitting elements 14. However, when water flows into the printed circuit board 10 due to user's carelessness, the influx water can cause an abnormality in the switches and/or the light-emitting elements, resulting in a malfunction or breakdown of the control switch module. One approach to solve this problem was to coat the printed circuit board 10 with urethane or acrylic material using a spray method.

The above information disclosed in this Background section is only for enhancement of understanding of the background of the invention and therefore it may contain information that does not form the prior art that is already known in this country to a person of ordinary skill in the art.

SUMMARY OF DISCLOSURE

Accordingly, the present invention has been made keeping in mind the above problems occurring in the prior art, and an object of the present invention is to provide a unified control switch module for vehicles, which enables a waterproof pad to be coupled to a printed circuit board, thus not only preventing a breakdown and a malfunction from occurring when water flows in, but also reducing/eliminating costs for coating the printed circuit board with urethane or acrylic material using a spray method.

The present invention provides a unified control switch module, including: a printed circuit board including switches and light-emitting elements mounted thereon; a waterproof pad coupled to the printed circuit board, and provided with first protrusions, which are formed at respective locations that correspond to the switches, and second protrusions having respective through-holes, which are formed at respective locations that correspond to the light-emitting elements; and one or more knobs located on the waterproof pad, and provided with respective lower ends, which are formed to extend outwards from the through-holes.

Preferably, the waterproof pad includes a concave drainageway, which is formed around the first protrusions, the second protrusions, or both such that the concave drainageway extends to an edge of the waterproof pad.

Also preferably, unified control switch modules according to the present invention may further include at least one drainage hole formed in the waterproof pad, the printed circuit board, or both so that when inflowing water streams down along a housing of the unified control switch module or the knob or knobs, the inflowing water can be drained through the drainage hole.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like.

The above and other features of the invention are discussed infra.

BRIEF DESCRIPTION OF THE DRAWINGS

The above and other objects, features and advantages of the present invention will be more clearly understood from the following detailed description taken in conjunction with the accompanying drawings, in which:

FIG. 2A is a view showing the construction of the waterproof pad of a unified control switch module according to the present invention;

FIG. 2B is an enlarged view of the portion S of FIG. 2A; and

DETAILED DESCRIPTION

Figure 1A:
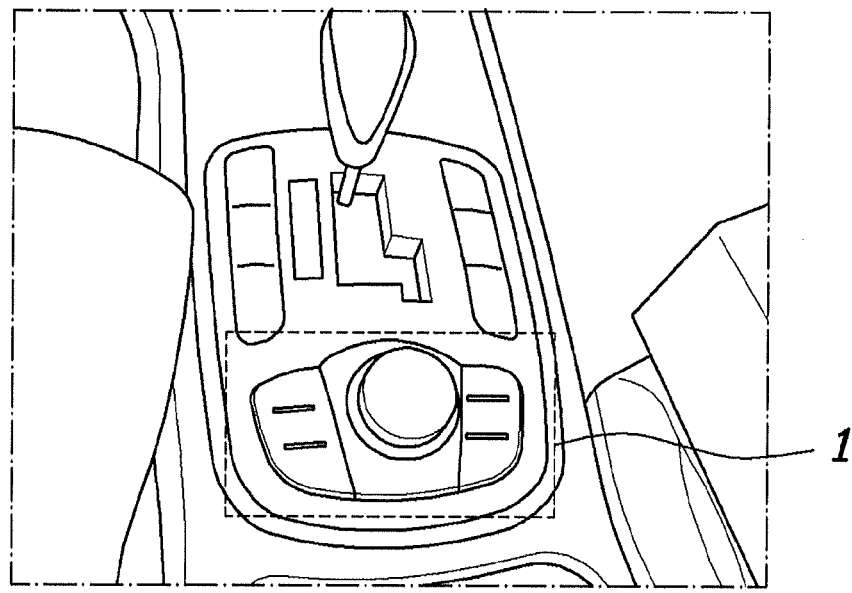
FIG. 1A is a schematic view showing the outer appearance of a typical vehicle indicator cover on which a unified control switch unit is mounted.
Figure 1B:
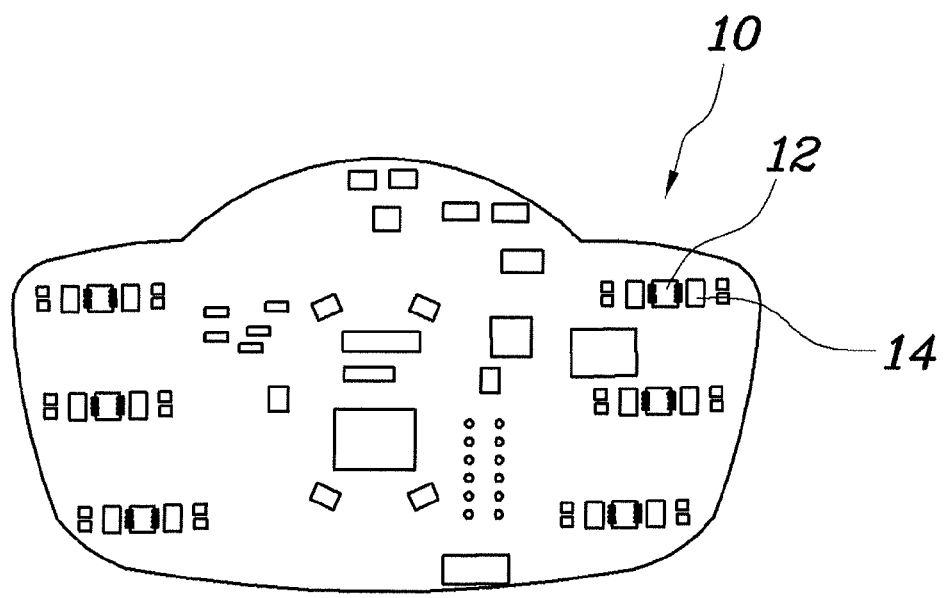
FIG. 1B is a view showing the construction of a printed circuit board, which is mounted to the typical unified control switch unit.

An embodiment of a unified control switch module according to the present invention is described in detail with reference to the accompanying drawings below.

A waterproof pad is coupled to a printed circuit board, on which switches and light-emitting elements are mounted.

As shown in FIG. 2A, a plurality of protrusions are formed on the waterproof pad 20. Referring to FIG. 2B, first protrusions 22 are formed at respective locations that correspond to the switches of the printed circuit board 10. Second protrusions 24, having respective through-holes 24a, are formed at respective locations that correspond to the light-emitting elements. Each of the protrusions functions as a waterproof wall when water flows in.

It is preferred that the waterproof pad 20 be made of rubber material having elasticity so that the first protrusions 22 can press the respective switches 12 of the printed circuit board 10 according to manipulation by a user.

Accordingly, when the user presses a button 32 mounted on a knob 30, a contact located in the central portion of the lower end of the knob 30 presses a corresponding first protrusion 22.

In this case, because the first protrusion 22 is a material having elasticity, a switch on the printed circuit board 10 can be pressed.

Furthermore, the second protrusions 24 have the respective through-holes 24a, so that light beams from the light-emitting elements 14 can be radiated through the respective through-holes 24a. Furthermore, the through-holes 24a have a protruding shape, so that no water can flow in the through-holes 24a even if the inflow of water occurs.

Figure 3:
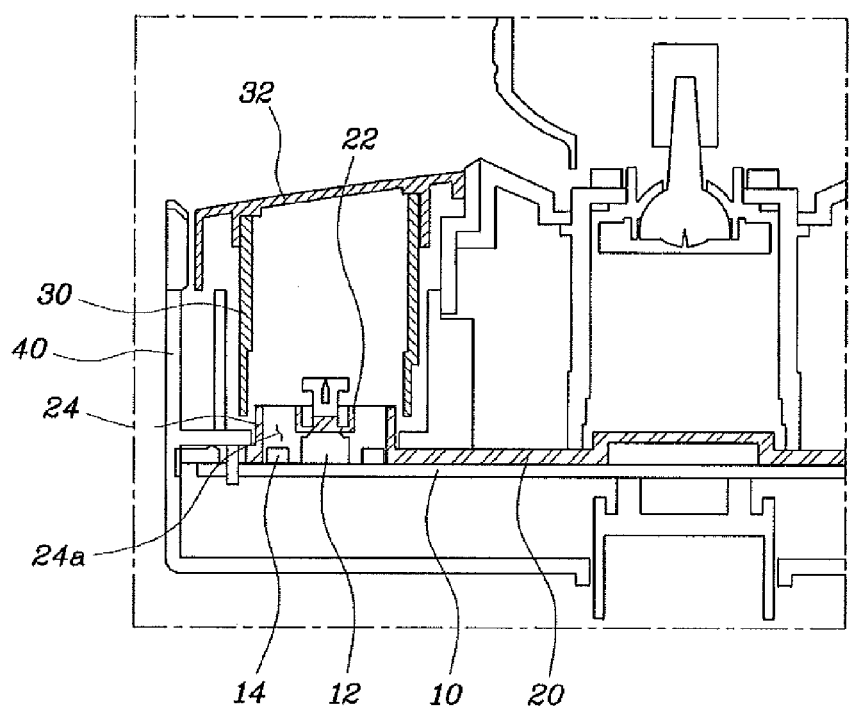
FIG. 3 is a sectional view of the unified control switch module according to the present invention.

As shown in FIG. 3, the button 32 has a dual structure that covers the upper edges of the knob 30, so that water can be prevented from flowing into the knob 30. Furthermore, the lower end of the knob 30 extends outwards from the through-holes 24a of the waterproof pad 20, and the upper end of the second protrusion 24 is positioned higher than the upper end of the knob 30, so that no water can flow in the through-holes 24a. The water that flows outside the knob 30 flows along a drainageway 26 of the waterproof pad 20 and is drained.

Furthermore in the case where water flows in between a housing 40 of the unified control switch module and the knob 30, the inflowing water streams down along the housing 40 or the knob 30, so that the inflowing water can be drained through a drainage hole formed at a corresponding location in the printed circuit board 10, the waterproof pad 20, or both.

With the above-described unified control switch modules, the problems of the malfunction and breakdown of the printed circuit board, attributable to the inflow of water, are mitigated. Furthermore, the cost is reduced because coating work is obviated.

Although the preferred embodiment of the present invention has been disclosed for illustrative purposes, those skilled in the art will appreciate that various modifications, additions and substitutions are possible, without departing from the scope and spirit of the invention as disclosed in the accompanying claims.

What is claimed is:

1. A unified control switch module, comprising:
   a printed circuit board including switches and light-emitting elements mounted thereon;
   a waterproof pad coupled to the printed circuit board, and provided with first protrusions surrounding through-holes in the waterproof pad, which are formed at respective locations in the waterproof pad to correspond to the switches, and second protrusions surrounding through-holes in the waterproof pad, which are formed at respective locations in the waterproof pad to correspond to the light-emitting elements, wherein the waterproof pad includes a concave drainageway, which is formed around both the first protrusions and the second protrusions so that the concave drainageway extends to an edge of the waterproof pad, the first and second protrusions forming a waterproof wall around through-holes in the waterproof pad; and
   one or more knobs located on the waterproof pad, and provided with respective lower ends, which are formed to extend outwards from the through-holes.

2. The unified control switch module as set forth in claim 1, further comprising at least one drainage hole formed in the waterproof pad, the printed circuit board or both so that when inflowing water streams down along a housing of the unified control switch module or the knob or knobs, an inflowing water can be drained through the drainage hole.

3. The unified control switch module as set forth in claim 1, further comprising at least one drainage hole formed in the waterproof pad, the printed circuit board or both so that when an inflowing water streams down along a housing of the unified control switch module or the knob or knobs, the inflowing water can be drained through the drainage hole.

\* \* \* \* \*